United States Patent [19]

Anderson et al.

[11] Patent Number: 5,119,148

[45] Date of Patent: Jun. 2, 1992

[54] FAST DAMPER DIODE AND METHOD

[75] Inventors: Samuel J. Anderson, Tempe; William C. Simpson, Mesa; Daniel J. Sullivan, Phoenix, all of Ariz.

[73] Assignee: Motorola, Inc., Schaumburg, Ill.

[21] Appl. No.: 642,717

[22] Filed: Jan. 17, 1991

Related U.S. Application Data

[63] Continuation of Ser. No. 443,615, Nov. 29, 1989, abandoned.

[51] Int. Cl.⁵ .................. H01L 29/92; H01L 29/06; H01L 29/12
[52] U.S. Cl. ......................... 357/14; 357/20; 357/58; 357/88; 357/89
[58] Field of Search ............ 357/13, 20, 12, 14, 357/55, 56, 88, 89, 58

[56] References Cited

U.S. PATENT DOCUMENTS

| | | | |
|---|---|---|---|
| 3,916,427 | 10/1975 | Ying et al. | 357/13 |
| 3,945,028 | 3/1976 | Krishna et al. | 357/13 |
| 4,274,103 | 6/1981 | Yamamoto et al. | 357/13 |
| 4,587,547 | 5/1986 | Amemiya et al. | 357/20 |
| 4,605,948 | 8/1986 | Martinelli | 357/13 |

*Primary Examiner*—Andrew J. James
*Assistant Examiner*—Ngan Van Ngo
*Attorney, Agent, or Firm*—Joe E. Barbee; Robert M. Handy

[57] ABSTRACT

An improved damper diode is obtained by replacing the usual step junction (P+-Nu-N+) structure of the prior art with an epitaxial double sided Pi-Nu structure (i.e., P+-Pi-Nu-N+) in which the thickness and impurity concentrations of the Pi and Nu regions are substantially equal and have a combined thickness about equal to the prior art Nu region for the same voltage. Improved transient response (TFR), better transient energy absorption capability (UIS) and lower forward transient turn-on peak over-shoot voltage (TOPO) is obtained for the same or higher reverse breakdown voltage (BVR), in the same or smaller die size.

10 Claims, 2 Drawing Sheets

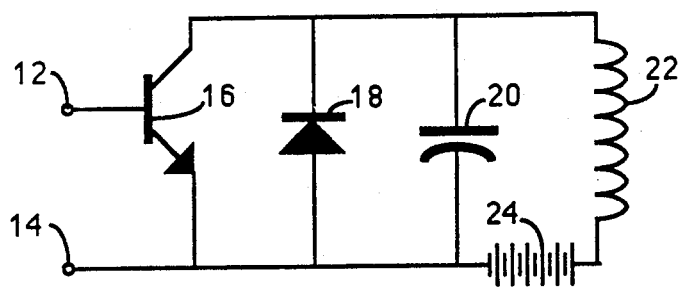
FIG. 1
PRIOR ART
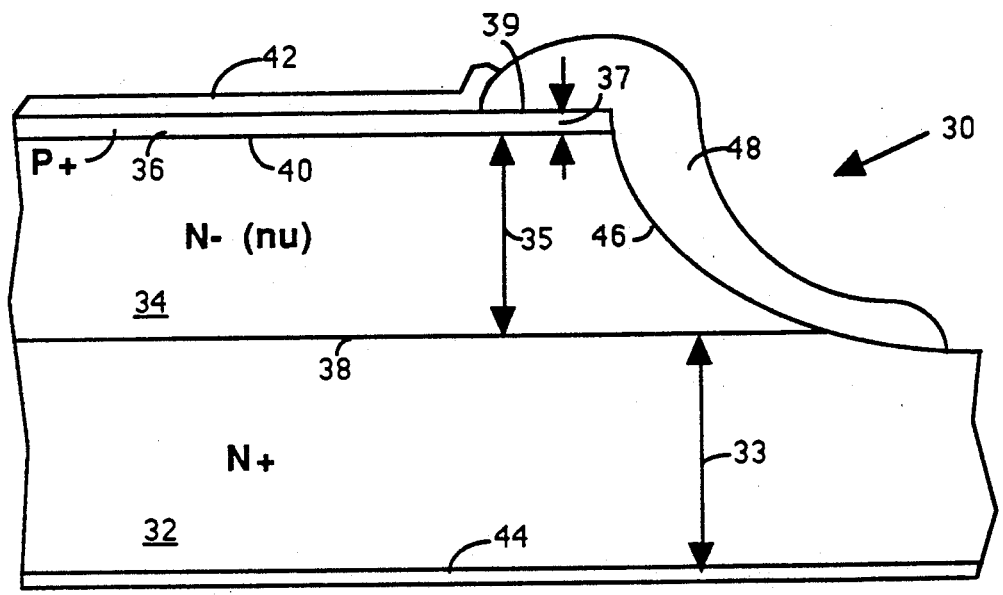
PRIOR ART    FIG. 2
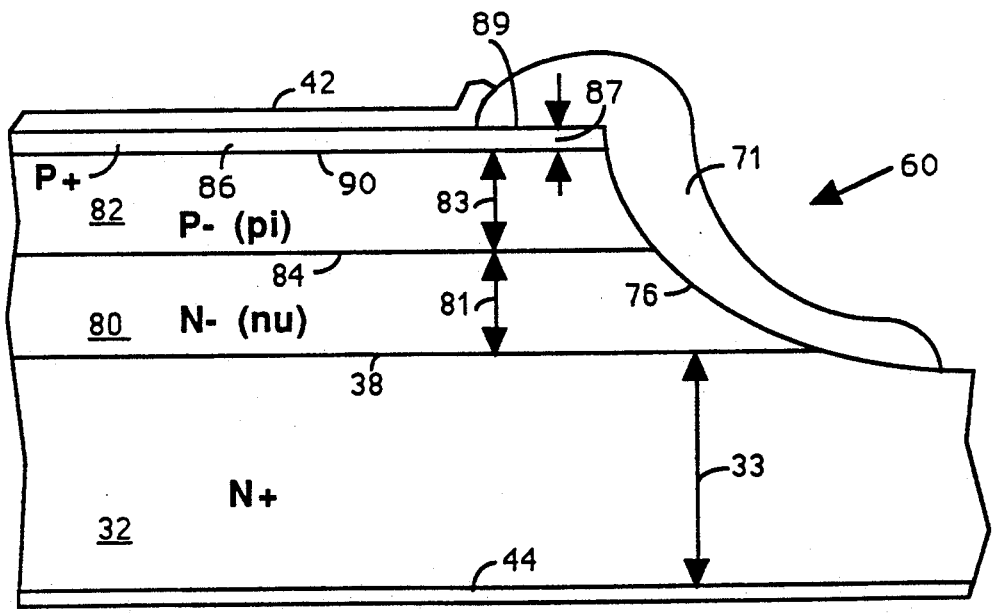
FIG. 5

FAST DAMPER DIODE AND METHOD

This application is a continuation of prior application Ser. No. 07/443,615, filed Nov. 29, 1989, now abandoned.

FIELD OF THE INVENTION

This invention relates to means and methods for high voltage, high power switching diodes and, more particularly, for high voltage, high power switching diodes for use, typically, in high resolution CRT monitor and television deflection applications.

BACKGROUND OF THE INVENTION

High voltage, high power diodes are widely used in solid state horizontal CRT monitor and television deflection circuits. They provide a conduction path during a portion of the deflection cycle and damp out unwanted oscillation (see for example, Kiver and Kaufman, "Television Simplified", 7th Edition, Delmar Publishers, Albany N.Y., pages 392-398). Such devices are referred to in the art as "damper diodes", and they must be able to withstand high voltages (e g., BVR ∼400-1600 volts), carry substantial currents (e.g., IF =∼1-10 amps), switch on and off rapidly (e.g., TRR and TFR ≦300 nanoseconds) and absorb substantial amounts of transient energy (e.g., UIS ≧1-5 milliJoules).

There is an ongoing need for greater picture definition, i.e., higher resolution, and larger screen formats in both CRT monitors and television displays. This in turn requires damper diodes with higher blocking voltages, faster switching and greater energy absorption capability. Other characteristics such as the transient forward voltage overshoot and the die size are also important.

While the properties of prior art damper diodes are adequate for some applications, they leave much to be desired for high performance applications, especially with larger format and higher resolution systems that are now emerging. Accordingly, there is an ongoing need for damper diodes having improved performance.

Various ways have been tried in the past to improve damper diode performance. For example, diode reverse blocking voltage (i.e., abbreviated BVR) and transient breakdown energy handling capability (measured as the amount of Unclamped Inductive Switching energy which a reverse biased unit can tolerate, abbreviated UIS) can be increased by increasing the resistivity and/or the thickness of the semiconductor diode depletion region. However, such modification typically increases the turn-on switching speed (i.e Transient Forward Recovery, abbreviated TFR) and the transient forward turn-on peak overshoot voltage (abbreviated TOPO).

The reverse recovery time (i.e. Transient Reverse Recovery, abbreviated TRR) may be lowered by introducing lifetime killer impurities into the space charge region. While this is successful, it increases the forward voltage drop (VF). The forward voltage drop (VF) and TOPO may be reduced and the rated forward current (abbreviated IF) may be increased by increasing the diode area (abbreviated DA). However, larger DA results in increased device cost, which is undesirable, especially in devices intended, among other things, for consumer applications.

What is needed is a means for decreasing TFR and TOPO and increasing UIS and BVR, without increasing DA, and without significant adverse affect on TRR, IF and VF. Up to now it has not been possible to provide high voltage, high current diodes in which some or all of those properties (e.g., BVR, TFR, TRR, UIS, TOPO, etc.) most critical for more advanced CRT deflection circuits are improved without an adverse affect on other important diode parameters and/or a substantial increase in DA and cost. Accordingly, a need continues to exist for improved means and methods that overcome these deficiencies of the prior art, and especially improved means and methods for damper diodes having equal or better BVR, UIS, TFR, TRR and TOPO.

BRIEF SUMMARY OF THE INVENTION

It is an object of the present invention to provide an improved means and method for high voltage, high power, fast switching diodes. It is a further object to provide diodes in which some of the most critical parameters (e.g., BVR, TFR, UIS and TOPO) are improved without significant increase in DA and without degradation of TRR, IF, VF or other important diode properties. It is an additional object to provide improved means and methods for diodes particularly adapted for use as damper diodes in higher resolution and/or larger format CRT deflection driver applications.

The foregoing and other objects and advantages are provided through a Pi-Nu diode structure comprising, in a preferred embodiment, a heavily doped semiconductor substrate of a first conductivity type (e.g., N+), a substantially uniformly lightly doped (e.g., Nu) first semiconductor region of a first thickness and first impurity concentration of the first type on the substrate, a substantially uniformly lightly doped (e.g., Pi) second semiconductor region of a second thickness and second impurity concentration of a second type opposite the first type on the first region and forming a PN junction with the first region, and a heavily doped third region of the second conductivity type (e.g., P+) in contact with the second region.

It is desirable that the (thickness)×(concentration) product for the first and second regions be substantially equal, preferably about $2 \times 10^{12}$ donors or acceptors/cm$^2$, and that the thicknesses of both the first and second regions be equal or greater than $(K_s E_c / qC)$, where $K_s$ is the dielectric constant of the semiconductor, q is the electronic charge and C is the impurity concentration in each region and $E_c$ is the breakdown field of the semiconductor.

It is desirable that the reverse blocking voltage be sustained approximately equally between the first and second regions. In a preferred embodiment, this is provided by having the first and second thicknesses and concentrations substantially equal.

For diodes with BVR values of about ≧1000 volts, it is desirable that the first and second dopant concentrations be about ≦$10^{15}$ /cm$^3$ and the first and second thicknesses each be about ≧50 micrometers. In the preferred implementation the PN junction extends to a contoured "mesa" type lateral periphery of the diode and is protected by a passivation layer.

The above-described improved diodes are provided by an improved fabrication process, according to a preferred embodiment, comprising, providing a heavily doped semiconductor substrate of a first conductivity type (e.g., N+), forming a substantially uniformly lightly doped (e.g., Nu) semiconductor region of a first thickness and first impurity concentration of the first type on the substrate, forming a substantially uniformly lightly doped (e.g., Pi) second semiconductor region of a second thickness and second impurity concentration of a second type opposite the first type on the first region, thereby forming a PN junction with the first region, and providing a heavily doped third region of the second conductivity type (e.g., P+) in contact with the second region.

It is desirable that the forming steps comprise providing thickness and concentrations such that the (thickness)×(concentration) product for the first and second regions are substantially equal and, preferably, about $2 \times 10^{12}$ donors or acceptors/cm$^2$, and that the thicknesses of both the first and second regions are equal and greater than ($K_s E_c/qC$), where $K_s$ is the dielectric constant of the semiconductor, q is the electronic charge and C is the impurity concentration in each region and $E_c$ is the breakdown field of the semiconductor.

It is also desirable that the forming steps comprise forming the first and second regions such that the reverse blocking voltage is sustained approximately equally between the first and second regions, and in the preferred embodiment, by having the first and second thicknesses and concentrations substantially equal.

For diodes with BVR values about $\geq 1000$ volts, it is desirable that the first and second forming steps comprise epitaxially forming the first and second regions with substantially uniform dopant concentrations about $\leq 10^{15}$ /cm$^3$ and first and second thicknesses of about $\geq 50$ micrometers.

After the first and second regions have been formed epitaxially, a mesa structure is desirably etched at the lateral periphery of the diode and the PN junction terminating there coated with a passivant.

As used herein the words "Nu" and "Pi" are intended to refer to very lightly doped semiconductor regions of N and P type, respectively, typically having ionized impurity (dopant) concentrations of about $\leq 10^{15}$ /cm$^3$, conveniently about $\leq 5 \times 10^{14}$ /cm$^3$, and preferably about $\leq 3 \times 10^{14}$ /cm$^3$.

The meaning of the parameters BVR, IF, TFR, TRR, UIS, TOPO, DA, VF, and IF are well understood in the art, but for convenience are briefly summarized here.

BVR is the reverse bias breakdown voltage determined as the voltage at an avalanche current ($I_R$) of typically $I_R = 1$ milliamp. IF is the rated forward operating current in amps, VF is the forward voltage drop at operating IF.

TFR is the transient forward recovery time, usually expressed in nanoseconds, and is determined as the time required for the diode to go from blocking at rated BVR to forward conduction of within 10% of steady state VF. TRR is the time, usually expressed in nanoseconds, required for the diode reverse recovery current to decrease to 10% of the final steady state reverse leakage current level.

UIS measures the transient energy absorbing capability of diodes by means of a standard "unclamped inductive switching" test, well known in the art in which, for example, a coil and reverse oriented diode are arranged in series. A shorting switch is provided across the diode. A known current is passed through the coil to store energy therein and then the switch is opened forcing most of the stored energy ($LI^2/2$) into the blocking diode which then avalanches or punches through. The amount of transient energy the reverse biased diode can absorb without failure is readily determined.

TOPO is the transient forward turn-on peak overshoot voltage that appears across the diode as it is switched from
blocking to forward conduction with a standard dV/dt, usually about 200 volts/microsecond, and is readily determined from a CRT trace.

DA is the diode area and is readily determined from measurement of the active diode area, which for high voltage mesa diodes is approximately equal to the die upper surface area.

The forgoing and other parameters employed in characterizing diodes, including damper diodes, are familiar to those of skill in the art.

BRIEF DESCRIPTION OF THE FIGURES

FIG. 1 shows a generic CRT deflection circuit utilizing a damper diode, according to the prior art;

FIG. 2 shows a simplified schematic cross-sectional view of a portion of a damper diode according to the prior art;

FIG. 5 shows a simplified schematic cross-sectional view of a portion of a damper diode according to the present invention.

DETAILED DESCRIPTION OF THE FIGURES

Figure 3:
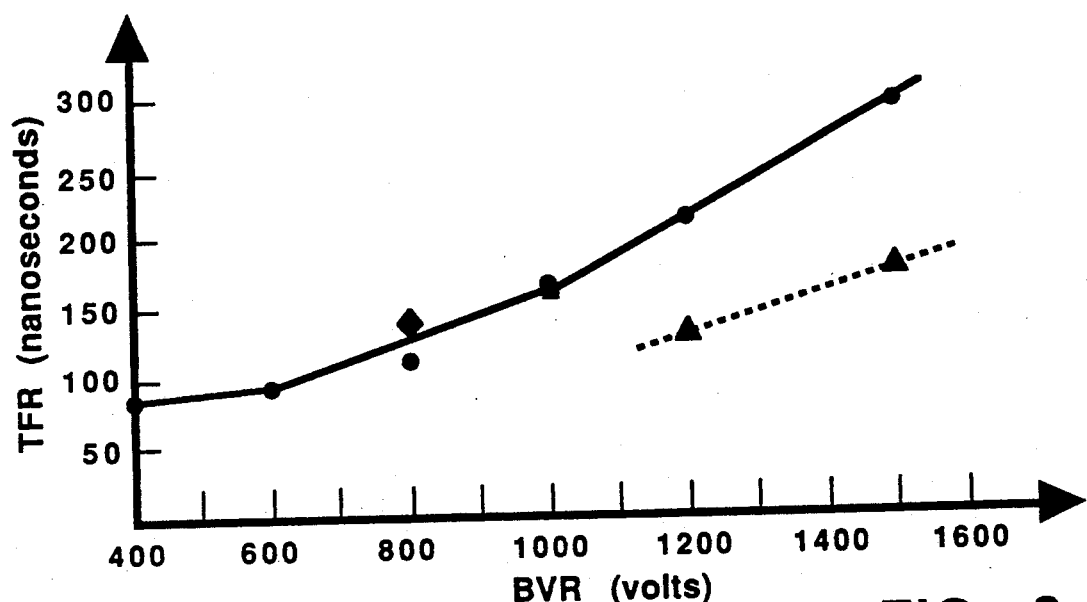
FIG. 3 shows a plot of TFR versus BVR and FIG. 4 shows a plot of TOPO versus BVR, for prior art devices and devices according to the present invention.

FIG. 1 shows prior art generic horizontal CRT deflection driver circuit 10 according to Kiver and Kaufman, supra. Circuit 10 comprises deflection input connection 12, common connection 14, driver transistor 16, damper diode 18, flyback capacitor 20, yoke coil or transformer 22 and DC power source 24. The operation of circuit 10 is well understood and will only be summarized here.

Transistor 16 is driven between saturation and cutoff. When transistor 16 is on, a substantially constant voltage determined by power source 24 appears across coil 22 and a linearly rising (positive) current flows through coil 22. This drives the CRT beam linearly from the center toward the (positive) edge of the CRT face. When the beam reaches the (positive) edge of the CRT face, the first half of the sweep cycle is completed and transistor 16 is turned off.

The coil current does not stop abruptly but continues to flow in the same (positive) direction and into capacitor 20 instead of through transistor 16. Yoke coil 22 and capacitor 20 form a resonant circuit whose period is $t = 2(LC)^{\frac{1}{2}}$, where L is the inductance of yoke coil 22 and C the capacitance of capacitor 20. The (positive) yoke current decays and when the coil voltage completes the first quarter sign wave of resonant oscillation, the coil current is zero, the capacitor voltage is a maximum and the CRT beam has returned to the starting position. The first half of the fly-back cycle is completed.

During the next quarter cycle of oscillation of the resonating coil-capacitor combination, capacitor 20 discharges through coil 22 and the current in coil 22 flows in the opposite (negative) direction, thereby providing the second half of the fly-back cycle, and driving the beam to the opposite (negative) side of the CRT from its initial deflection. When the (negative) coil current reaches its maximum at the end of the second quarter cycle of resonant oscillation, the CRT beam is at its maximum (negative) deflection and the second half of the fly-back cycle is completed.

The (negative) coil current does not stop abruptly but continues to flow in the same (negative) direction. In the absence of diode 18, the current would flow back to capacitor 20 and the resonant circuit would continue to ring with period $t=2(LC)^{\frac{1}{2}}$, but this is not what is desired. When the polarity of yoke 22 reverses at the end of the second quarter cycle of oscillation (i.e., the end of the second half of the fly-back cycle), damper diode 18 becomes forward biased and cuts off further oscillation. The yoke current begins to decrease linearly toward zero through damper diode 18, thereby initiating the second half of the linear sweep cycle and moving the CRT beam back toward the center starting position. The yoke energy is returned to the power source rather than the capacitor. When the yoke current reaches zero, the CRT beam is at the center starting position, the second half of the sweep cycle is completed, diode 18 turns off, transistor 16 turns on and the above-described sequence recommences.

Even in a rudimentary television CRT, the horizontal sweep repetition rate is 15,750 cps and the fly-back period is a few microseconds. In more advanced high resolution CRT's, the horizontal sweep repetition rate may be five or ten times higher and the fly-back period correspondingly smaller. Thus, damper diode 18 must be able to switch on or off in a fraction of a microsecond, usually in less than about 300 nanoseconds and preferably in 200 nanoseconds or less. Further, the transient voltage across the yoke and the damper diode can be very large, e.g., $\geq 600$ volts, sometimes $\geq 1000$ volts, so a high reverse breakdown voltage is also required.

In addition, the damper diode also protects the transistor from damage due to having reverse polarity applied to the transistor which can cause emitter-base junction breakdown. Since the emitter-base breakdown voltage is typically very low (e.g., about $\leq 10$-20 volts), the transient over-voltage required to turn-on the damper diode (TOPO) is a very important property of the diode. If the TOPO value of the damper diode is too high, the accompanying transistor will experience a high failure rate.

While the use of a high speed, high power, high voltage switching diode in a CRT deflection application has been illustrated using the circuit of FIG. 1, those of skill in the art will understand that this is merely for convenience of understanding and that the present invention is not limited to the particular circuit or application shown. Many variations and other circuits are known for deflection applications and high speed, high power, high voltage switching diodes are also used in other important applications well known in the art.

The properties of high power, high speed, high voltage diodes are intimately linked to their internal construction. The internal construction of prior art damper diodes is illustrated in FIG. 2. FIG. 2 is a simplified schematic cross-sectional view through portion 30 of a prior art damper diode, comprising N+substrate 32 of thickness 33 and having surface 38 on which is provided lightly doped N−(Nu) layer 34 of thickness 35 and P+layer 36 of thickness 37. PN junction 40 is formed between P+layer 36 and Nu layer 34 and is substantially a one-sided step junction. The thickness and doping of Nu layer 34 between PN junction 40 and interface 38 with N+substrate 32 are generally chosen to support the reverse bias space charge region without punch-through at the rated BVR value. Means and methods for doing this are well known in the art. Layer 34 is usually formed by epitaxial growth with uniform doping.

Metal regions 42 and 44 are provided for making contact to P+region 36 and N+substrate 32, respectively. Because such diodes must typically withstand high BVR values (i.e., $\geq 600$ volts, sometimes $\geq 1000$ volts), "mesa" contoured surface 46 covered by passivation layer 48 is provided at the periphery of diode 30 where PN junction 40 is otherwise exposed. Contour 46 and passivation 48 reduce field crowding and surface states that would otherwise severely degrade BVR. Means and methods for constructing such devices are well known in the art.

Figure 4:
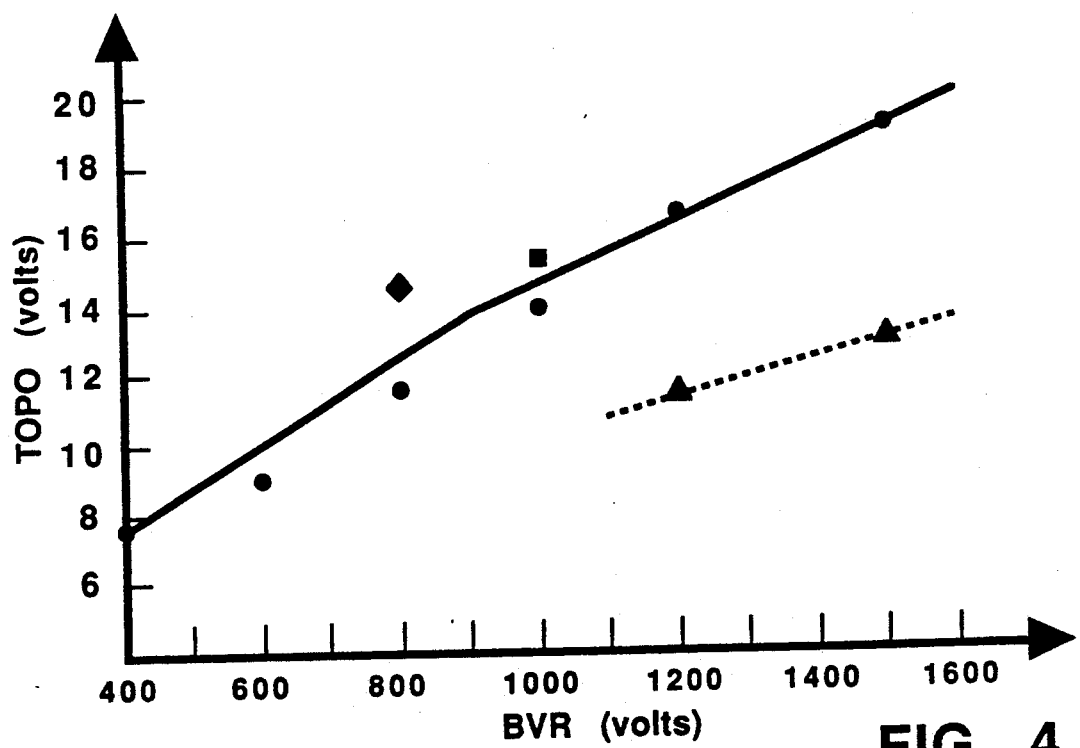

FIG. 3 and 4 show how TFR and TOPO varies with increasing BVR. The solid line indicates the trend obtained from various prior art devices. Data points represented by the circles are measured and extrapolated results for prior art type damper diodes manufactured by Motorola, Inc., and the diamond and square data points are for devices manufactured by other diode manufacturers. These devices had diode areas (DA) of about 7 mm$^2$, UIS values of about 1-5 J and comparable IF, VF and TRR values.

It can be seen from the data of FIGS. 3-4, based on measurements of devices from three different manufacturers, that traditional methods for obtaining higher values of BVR cause substantial increases in TFR and TOPO. Historically, the only method known for overcoming this undesirable situation has been to increase the diode area. But this is uneconomic. Accordingly, another approach is needed in which improved diode performance, and especially improved BVR, UIS, TFR and TOPO, can be obtained without substantial penalty on other diode parameters and without an increase in diode area.

Devices prepared according to the teachings of the present invention have significantly improved properties. Measurements of TFR and TOPO on such devices are shown by the triangular shaped data points and dashed lines of FIGS. 3-4. In addition to having improved TFR and TOPO, the invented devices have substantially better UIS (e.g., 20 mJ versus 1-5 mJ) with equal or smaller DA (e.g., 6.5 mm$^2$ versus 7 mm$^2$). These improved diodes have the device structure illustrated in FIG. 5 and are formed by the method described below.

FIG. 5 is a simplified schematic cross-sectional view, similar to FIG. 2, but of a high voltage, high power, high speed diode, according to a preferred embodiment of the present invention. Where the same identification numbers are used in FIGS. 2 and 5, they indicate like regions.

Referring now to FIG. 5, device portion 60 comprises N+substrate 32 having thickness 33 and surface 38, N−(Nu) region 80 having thickness 81 on surface 38 of substrate 32, P−(Pi) region 82 of thickness 83 forming PN junction 84 with region 80, and P+region 86 of thickness 87 on region 82 at interface 90. Metal contacts 42, 44 are provided to P+region 86 and N+substrate 32, respectively.

In a preferred embodiment, PN junction 84 extends to contoured lateral periphery 76 of portion 60. Lateral periphery 76 is desirably shaped in a "mesa" form to aid in reducing field crowding where junction 84 intersects periphery 76. Passivation layer 71 is provided over junction 84, desirably extending up onto region 86.

While the "mesa" shaping and passivation layer may be the same as in the prior art, the results are different because of the difference in location of the PN junction with respect to the "mesa" and passivation. This is explained more fully below.

The structure of FIG. 5 differs in several respects from the prior art structure shown in FIG. 2. For example, in the prior art device of FIG. 2, PN junction 40 is located relatively close to upper device surface 39 and is therefore more susceptible to crystalline defects associated with semiconductor surface 39. Also, the maximum electric field (which occurs at the junction) is relatively close to upper surface 39 where the slope of "mesa" contoured periphery 46 is large, i.e., nearly vertical, and the effectiveness of the contour in limiting reduction of BVR due to field crowding is reduced. Further, the junction is one-sided, that is, the reverse bias depletion region extends substantially only into Nu region 34.

In the device of the present invention, illustrated in FIG. 5, PN junction 84 is located much deeper into the device and so is less sensitive to defects associated with semiconductor surface 89. Also, the maximum electric field is located substantially about half-way down the slope of contoured periphery 76, where the slope is lower, so that greater field spreading benefit is derived from the "mesa" shape and the resulting BVR more closely approaches the theoretical maximum. Further, the junction is double-sided so that the reverse bias depletion region extends into both Nu region 80 and Pi region 82. As will be more fully explained later, these features of the invented structure have important benefits.

When the diode is under reverse bias, the maximum electric field in regions 80, 82 must be less than the breakdown field $E_c$ for the semiconductor material or the device will break down, e.g., avalanche. It is desirable that the reverse bias voltage being sustained by the diode be distributed across both regions 80, 82 and that the product of the (impurity concentration)×(thickness) of each of regions 80, 82 be substantially the same and, preferably for devices with BVR of $\geq 1000$ volts, have a value of about $2 \times 10^{12}$ donors or acceptors/cm². It is further desirable that the thickness 81, 83 of each region be equal or greater than $K_s E_c/qC$, where $K_s$ is the dielectric constant of the semiconductor, q is the electronic charge and C is the impurity concentration in each region and $E_c$ is the breakdown field of the semiconductor.

It is preferred that the thickness and doping concentration of regions 80, 82 be chosen so that breakdown is by avalanche rather than punch-through and so that the applied reverse bias is approximately equally divided across regions 80, 82. This provides the greatest value of BVR. This is preferably accomplished by having the thicknesses and concentrations of regions 80, 82 be about the same, and having the thicknesses of regions 80, 82 be larger than the maximum depletion region width in each region for a reverse voltage of BVR/2 for each region.

For diodes having BVR $\geq 1000$ volts, it is desirable that the impurity concentrations in regions 80, 82 be equal or less than about $10^{15}$/cm³, conveniently about $5 \times 10^{14}$/cm³ or less, and preferably about $3 \times 10^{14}$/cm³ or less, and thicknesses 81, 83 should be about 50 micrometers or larger, conveniently about 50-80 micrometers or larger, and preferably in the range of about 50-70 micrometers or larger.

A substantial advantage of the double sided, symmetric $P^+$-Pi-Nu-$N^+$ structure of the present invention is that for the same total epi region thicknesses (e.g., the sum of thicknesses 81 plus 83 approximately equal to thickness 35), the maximum electric field within the $P^+$-Pi-Nu-$N^+$ device is less than that encountered in the one-sided $P^+$-Nu device. When BVR is controlled by the maximum electric field $E_c$, as is the case for avalanche breakdown, then for the same doping concentrations and total layer thickness, the double sided structure will have a higher BVR.

Pi-Nu structures have been used for almost twenty years in connection with transistors (see for example, Denning and Moe, "Epitaxial Pi-Nu NPN High voltage Power transistors", IEEE Transactions on Electron Devices, Vol. ED-17, No. 9, Sep. 1970, pages 711-716), but have not been previously applied to high voltage diodes, nor have their advantages in connection with high voltage diodes, particularly damper diodes, been previously appreciated by others, despite the long standing need for higher performance diodes and the long standing knowledge of Pi-Nu transistors by those of skill in the art.

For example, it has not been appreciated that the same or higher values of BVR can be obtained in diodes without resorting to such lightly doped (low impurity concentration) layers as have been necessary in the past with high voltage diodes employing one sided $P^+$-Nu (or $N^+$-Pi) structures. For example, prior art $P^+$-Nu-$N^+$ avalanche type damper diodes for BVR $\geq 1000$ volts typically require a 100-140 micrometers thick Nu layer of 30-45 ohm-cm (about $1 \times 10^{14}$/cm³ N-type). With the preferred embodiment of the present invention wherein about half the rated BVR is dropped across the Nu region and about half across the Pi region, and for the same or higher design BVR as the prior art diodes, the doping concentration of the Nu and Pi layers can be at least three times higher than previously used. For example, about 65 micrometers of 18-26 ohm-cm Nu (about $3 \times 10^{14}$/cm³ N-type material), combined with the same thickness of about 45-65 ohm-cm Pi (about $3 \times 10^{14}$/cm³ P-type material), gives the same or higher BVR than obtained with the above noted $P^+$-Nu-$N^+$ device. This is a very significant practical manufacturing advantage because of the great difficulty of forming uniform and reproducible very lightly doped layers by epitaxy or otherwise in the presence of a highly doped substrate (e.g., $\leq 0.003$ ohm-cm, i.e., $\geq 3 \times 10^{19}$/cm³ N-type) and/or similarly doped surface regions. In addition, the lower resistivity of the series connected Pi-Nu regions tends to reduce the series resistance of the diode under forward conduction, which is also an advantage.

Further it has not been previously appreciated that by using a Pi-Nu diode structure, manufacturing is made easier in several other respects as well. As noted earlier, because the PN junction is now at Pi-Nu interface 84 rather than at $P^+$-Nu interface 40 it is substantially in the middle of epitaxial layers 80, 82, about half way between $N^+$ substrate 32 and $P^+$ surface region 86, and so is well away from crystalline defects associated with surface 89, and is in a more favorable location (lower slope angle) with respect to the effect of edge contour 76 in spreading the fringing field.

Further, $P^+$ region 86 may now be made substantially thinner than $P^+$ region 36. Previously, a comparatively deep diffusion (e.g, $x_j$ about 10-40 micrometers with $C_s$ about $2 \times 10^{19}$/cm³) was required for $P^+$ region 36 because of the need to locate PN junction 40 formed between P+region 36 and Nu region 34 as far away from surface 39 and as far down "mesa" wall 46 as practical. Even greater junction depth would be desirable, but the cost of the very long diffusion times necessary to achieve such deep junctions is prohibitive. Also, with such long diffusion times there is an increased likelihood of generating further crystalline defects near the junction.

With the invented structure, comparatively thin and higher surface concentration P+doped region 86 may be used (e.g., depth <10 micrometers with $C_s > 2 \times 10^{19}$ /cm$^3$), since region 86 merely forms a low resistance contact to Pi region 82 and does not form PN junction 84. Also, a comparatively high level of defects can now be tolerated in P+region 86 because such defects have little or no influence on more deeply lying PN junction 84. Unlike many typical IC's and low voltage discrete devices, defects near the PN junction of a high voltage, high power device are of great significance because of their great influence on the diode leakage current at high reverse bias and transient behavior of the diode.

In addition, it has been discovered that invented Pi-Nu diode structure has other advantages not previously known or readily predictable from the prior art. For example, it is found that for the same or higher BVR and the same or smaller DA, that TFR, UIS and/or TOPO are substantially improved with no significant degradation of TRR, VF and IF.

The results of tests on BVR, TFR and TOPO performed on damper diodes fabricated according to the present invention are shown by the dashed line through the triangular shaped data points in FIGS. 3 and 4. These diodes had DA=6.5 mm$^2$, which is smaller than the prior art diodes. Despite the smaller area, the invented diodes showed substantially lower TFR and TOPO. In addition, UIS measurements showed that these diodes had UIS=20 mJ, which is 4-20 times that of prior art diodes having greater area. The TRR, VF, and rated IF were comparable.

The above-described devices are conveniently fabricated, in a preferred embodiment, by providing a (111) N+silicon wafer substrate which has been cleaned using methods well known in the art, placing the substrate in a conventional epi-reactor and depositing on the substrate about 50-100 micrometers, conveniently about 55-85 micrometers, and preferably about 60-70 micrometers of lightly doped N-type (Nu) semiconductor of, for example, 10-70 ohm-cm resistivity, conveniently 14-65 ohm-cm, and preferably about 18-26 ohm-cm resistivity, then epitaxially depositing a further layer of about 60-110 micrometers, conveniently about 65-90 micrometers, and preferably about 60-70 micrometers of lightly doped P-type (Pi) semiconductor of, for example, 20-140 ohm-cm resistivity, conveniently 28-130 ohm-cm, and preferably about 45-55 ohm-cm resistivity, then P+doping the outer surface of the Pi layer to, for example, $C_s$ of about $2-5 \times 10^{19}$ /cm$^3$ and about 10 micrometers depth, and then in any convenient order, providing metallic contacts to N+substrate 32 and P+region 86, mesa etching diode periphery contour 76, and covering exposed junction 84 with passivant 71.

It is desirable to provide a lifetime killer such as gold, platinum, a combination thereof, and/or high energy electron irradiation in the lightly doped Pi-Nu regions to assist in adjusting TRR. Platinum is preferred and is introduced into the epitaxial layers before metallization. Means and methods for carrying out each of the above described steps are well known in the art.

It is desirable but not essential that the steps of forming the sequential Nu and Pi layers by epitaxial growth be carried out in the same reactor without intermediate removal. It is further desirable that the doping concentration within the Pi and Nu layers be substantially constant, except at the interface therebetween and and the interfaces with the underlying or overlying highly doped regions. Very thin transition regions inevitably occur at these interfaces. The transition between the Pi and Nu layer is, so far as is practical, desired to be abrupt rather than graded, but this is not essential. While the transitions between the N+and Nu layer and P+and Pi layers are also nominally desired to be abrupt, they may be graded so long as there are provided Pi and Nu layers having substantially the intended light doping over at least the widths described above.

Aluminum and chrome-nickel-gold are examples of suitable contact metals and doped oxides, photo-glass, oxygen doped polysilicon, organic polymers, nitrides and combinations thereof are examples of suitable junction passivants. The preferred passivant is a layered structure comprising oxygen doped polysilicon, doped oxide, photo-glass, and doped oxide, although other passivants will also serve. Passivant 71 is desirably applied after mesa etching and before metallization.

Having thus described the structure, it will be readily apparent to those of skill in the art that high voltage, high power, fast switching diodes of improved properties are obtained, and which are particularly well adapted for use in advanced CRT deflection circuits, and that the invented process provides for economical manufacture thereof.

Those of skill in the art will appreciate, based on the description herein, that while the invention has been described in terms of particular combinations of P or N, that alternative structures in which P and N are interchanged are also included within the scope of the invention. For example and not intended to be limiting, a P+substrate could be used, the Pi layer deposited first, the Nu layer second and the N+region formed last, so that the resulting structure is, starting from the substrate, P+-Pi-Nu-N+. Also, while the invented devices are described as utilizing an etched mesa contoured periphery, other methods for controlling the junction fringing field can also be employed without departing from the present invention.

Further, while the present invention has been described in terms of certain semiconductor materials, metals and passivants, those of skill in the art will understand based on the description herein that other semiconductors, metals and passivants could also be used. Accordingly, it is intended to include these and other variations as will occur to those of skill in the art based on the description herein in the claims that follow.

We claim:

1. A damper diode having first and second opposed principal surfaces separated by a sequence of semiconductor layers of, respectively, (P+)(P−)(N−)(N+) doping, wherein the ($P^{31}$ )(N−) layers have substantially equal thickness each greater than about fifty micrometers and substantially uniform equal doping density of less than about $10^{15}$ dopant atoms per cubic centimeter, and the (P+)(N+) layers each have an ohmic contact thereon.

2. The damper diode of claim 1 wherein the (P+) layer is adjacent the first principal surface, and further comprising a recessed peripheral portion extending substantially through the (P+)(N−) layers, wherein a PN junction boundary between the (P−)(N−) layers intersects a sidewall of the recessed peripheral portion at least about sixty micrometers from the first principal surface.

3. A high voltage, high current, high speed switching damper having opposed principal surfaces and comprising a first highly doped region of a first conductivity type adjacent the first principal surface, a second highly doped region of a second, opposite, conductivity type adjacent the second principal surface, a third substantially uniformly doped region of the first conductivity type of predetermined thickness in contact with the first region and having a dopant concentration of about $10^{15}$ impurity atoms/cm$^3$ or less, a fourth substantially uniformly doped region of the second conductivity type and substantially equal thickness and dopant concentration as the third region in contact with the second region and forming a PN junction with the third region, and metallic electrodes on the first and second principal surfaces forming ohmic contacts with the first and second regions.

4. The damper diode of claim 3 wherein the PN junction is spaced more than about fifty micrometers from either surface.

5. The damper diode of claim 3 wherein the PN junction is spaced more than about sixty micrometers from either surface.

6. The damper diode of claim 3 further comprising a peripheral depression intersecting the first surface, and wherein the PN junction intersects a sidewall of the depression more than about fifty micrometers from the first surface.

7. The damper diode of claim 6 wherein the sidewall has a smaller periphery near the first surface and a larger periphery where the PN junction intersects.

8. The damper diode of claim 3 wherein the thickness of the third region is about fifty micrometers or more.

9. The damper diode of claim 3 wherein the dopant concentration is about $5 \times 10^{14}$ dopant atoms/cm$^3$ or less.

10. The damper diode of claim 9 wherein the dopant concentration is about $3 \times 10^{14}$ dopant atoms/cm$^3$ or less.

* * * * *

UNITED STATES PATENT AND TRADEMARK OFFICE
CERTIFICATE OF CORRECTION

PATENT NO. : 5,119,148

DATED : June 2, 1992

INVENTOR(S) : Samuel J. Anderson et al

It is certified that error appears in the above-identified patent and that said Letters Patent is hereby corrected as shown below:

Claim 1, column 10, line 61, change "($P^{31}$)" to --($P^-$)--.

Claim 2, column 11, line 2, after "($P^+$)", insert --($P^-$)--.

Claim 3, column 11, line 8, after "damper", insert --diode--.

Signed and Sealed this

Fifth Day of October, 1993

Attest:

BRUCE LEHMAN

*Attesting Officer*  *Commissioner of Patents and Trademarks*